(12) United States Patent
Tseng

(10) Patent No.: US 8,987,870 B2
(45) Date of Patent: Mar. 24, 2015

(54) BRIDGE RECTIFIER AND METHOD FOR SAME

(71) Applicant: Lite-On Semiconductor Corp., New Taipei (TW)

(72) Inventor: Ching-Chiu Tseng, Keelung (TW)

(73) Assignee: Lite-On Semiconductor Corp., New Taipei (TW)

( * ) Notice: Subject to any disclaimer, the term of this patent is extended or adjusted under 35 U.S.C. 154(b) by 0 days.

(21) Appl. No.: 13/935,899

(22) Filed: Jul. 5, 2013

(65) Prior Publication Data

US 2015/0008564 A1 Jan. 8, 2015

(51) Int. Cl.
*H01L 27/08* (2006.01)
*H01L 21/22* (2006.01)

(52) U.S. Cl.
CPC ............ *H01L 27/0814* (2013.01); *H01L 21/22* (2013.01)
USPC .... 257/658; 257/119; 257/288; 257/E27.002; 257/E29.001

(58) Field of Classification Search
CPC ................................ H01L 29/00; H01L 25/03

USPC ........... 257/119, 597, 658, E27.002, E29.001
See application file for complete search history.

(56) References Cited

U.S. PATENT DOCUMENTS

| 2011/0141636 A1* | 6/2011 | Golke et al. | 361/56 |
| 2014/0097882 A1* | 4/2014 | Marki | 327/356 |

* cited by examiner

*Primary Examiner* — Mamadou Diallo
(74) *Attorney, Agent, or Firm* — Li & Cai Intellectual Property (USA) Office

(57) ABSTRACT

A bridge rectifier including a common P-type diode, a common N-type diode, two first metal layers, two pairs of second metal layers, two AC inputs and two DC outputs. The P-type diode includes a common P-type doping region, a pair of first N-type substrate regions and a pair of P-type doping regions. The N-type diode includes a common N-type doping region, a pair of second N-type substrate regions and a pair of N-type doping regions. The first metal layers connect to the common N-type doping region and the common P-type doping region. The second metal layers connect to the P-type doping region and the N-type doping region. Two AC inputs connect to one of the second metal layers of the P-type diode and one of the second metal layers of the N-type diode respectively. Two DC inputs connect to the first metal layers respectively.

5 Claims, 11 Drawing Sheets

BRIDGE RECTIFIER AND METHOD FOR SAME

BACKGROUND

1. Technical Field

The present invention relates to a rectifier and a manufacturing method for same, and in particular to a bridge rectifier and a manufacturing method for the same.

2. Description of Related Art

The bridge rectifier is a common rectifier to transfer the alternating current into the direct current. In general, the recent bridge rectifier is composed of four individual diode dies. Each of the diode dies has two electrode contacts. Moreover, the diode dies are connected with each other by the method of soldering with the lead or the lead frame. That's to say, in the process of manufacturing the recent bridge rectifier, it is necessary to integrate four diode dies to form the bridge rectifier.

SUMMARY

The present invention provides a bridge rectifier including two diode dies. The diode dies can simplify the manufacturing method of the bridge rectifier.

The present invention provides a method of manufacturing the above mentioned bridge rectifier.

The present invention provides a bridge rectifier including a common P-type diode, a common N-type diode, two first metal layers, two pairs of second metal layers, two AC inputs and two DC outputs. The common P-type diode includes a common P-type doping region, a pair of first N-type substrate regions and a pair of N-type doping regions. The first N-type substrate regions are positioned between the common P-type doping region and the N-type doping regions. The common N-type diode includes a common N-type doping region, a pair of second N-type substrate regions and a pair of P-type doping regions. The second N-type substrate regions are positioned between the common N-type doping region and the P-type doping regions. The first metal layers connect to the common N-type doping region and the common P-type doping region respectively. Two pairs of second metal layers connect to the pair of P-type doping regions and the pair of N-type doping regions respectively. The AC inputs each connect to one of the second metal layers in the common N-type diode and one of the second metal layers in the common P-type diode. The DC outputs each connect to the first metal layers.

The present invention provides a manufacturing method of the bridge rectifier. Firstly, two N-type substrates are provided. Next, two sides of each N-type substrates are performed doping to from a N-type heavy doping in one side and a P-type doping in the other side respectively. Then, one trench is formed in the side with N-type heavy doping of the N-type substrate to from a common P-type diode. The common P-type diode includes a common P-type doping region, a pair of N-type doping regions and a pair of first N-type doping regions. The other trench is formed in the side of the P-type doping in the other N-type substrate to form a common N-type diode. The common N-type diode includes a common N-type doping region, a pair of P-type doping regions and a pair of second N-type doping regions. Two first metal layers are form on the common P-type doping region and the common N-type doping region respectively. Two pairs of the second metal layers are form on the pair of N-type doping regions and the pair of P-type doping regions respectively. Two AC inputs are formed on one of the second metal layers on the common N-type diode and one of the second metal layers on the common P-type diode. Two DC outputs are formed to each connect to the first metal layers respectively.

The present invention provides a manufacturing method of the bridge rectifier. Firstly, two N-type substrates are provided. Then, one side of the N-type substrate is preformed P-type doping to form a common P-type doping region and a P-type extending portion. One side of the other N-type substrate is preformed N-type doping to from a common N-type doping region and a N-type extending portion. The side of the N-type substrate with P-type extending portion is preformed N-type heavy doping to from a common P-type diode. The side of the N-type substrate with the N-type extending portion is preformed P-type doping to from a common N-type diode. Two first metal layers are formed on the common P-type doping region and the common N-type doping region respectively. Two pairs of second metal layers are formed on the pair of P-type doping regions and the pair of N-type doping regions respectively. Two AC inputs each connects to one of the second metal layers of the common N-type diode and one of the second metal layers of the common P-type diode respectively. Two DC outputs connect to two first metal layers respectively.

To sum up, the present invention provides a bridge rectifier and the manufacturing method for the same. The bridge rectifier includes a common P-type diode and a common N-type diode. The common P-type diode includes two separated N-type electrodes. The two separated N-type electrodes use the same common P-type doping region. The common N-type diode includes two separated P-type electrodes. The two separated P-type electrodes use the same common N-type doping region. Compare to the tradition bridge rectifier, the number of the common P/N type diodes in the present invention can be decreased. Thus, the manufacturing method of the bridge rectifier can be simplified.

In order to further appreciate the characteristic and technical contents of the present invention, references are hereunder made to the detailed descriptions and appended drawings in connection with the present invention. However, the appended drawings are merely shown for exemplary purpose rather than being used to restrict the scope of the present invention.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
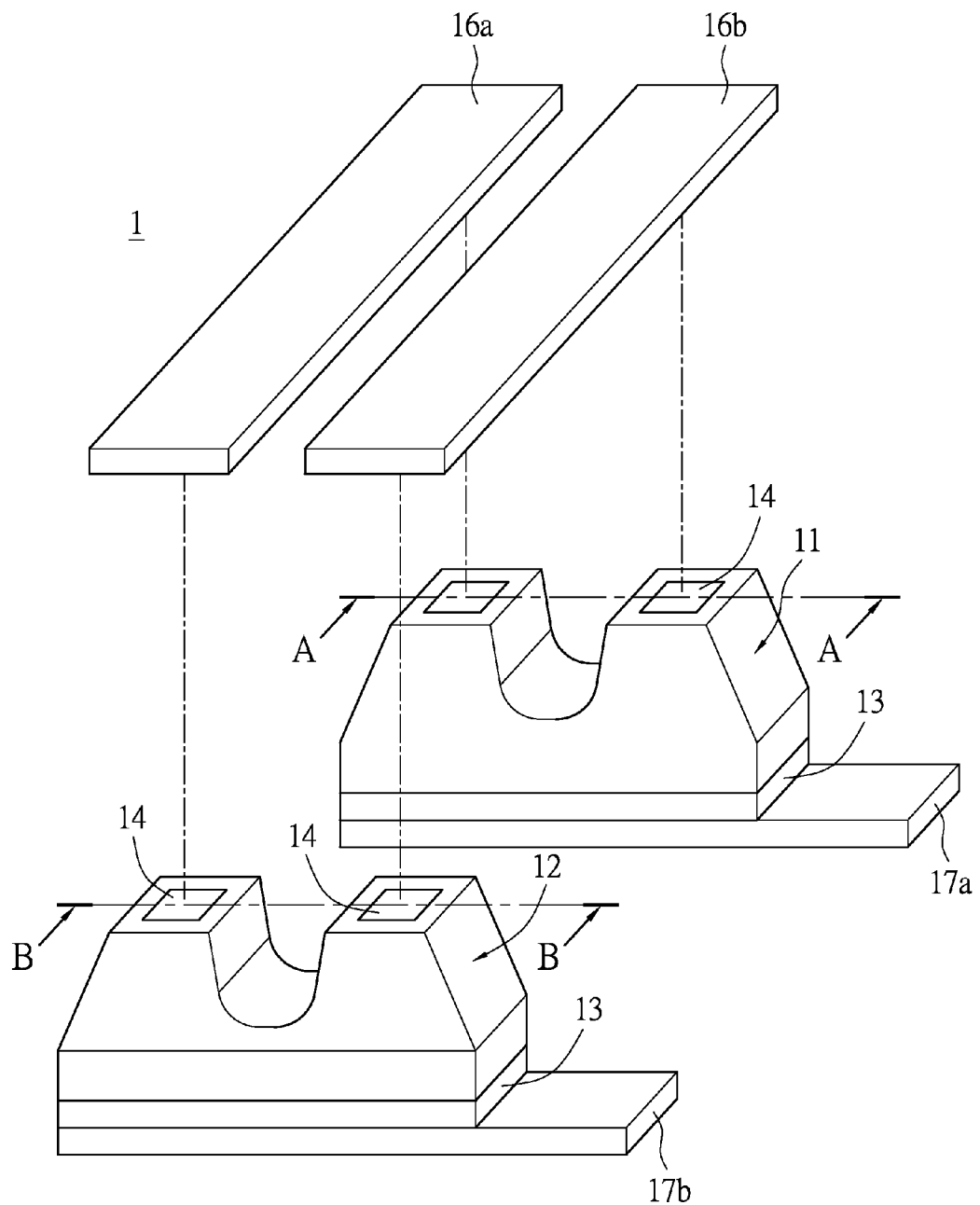
FIG. 1 is the perspective view of the bridge rectifier of the first embodiment in the present invention.
Figure 1A:
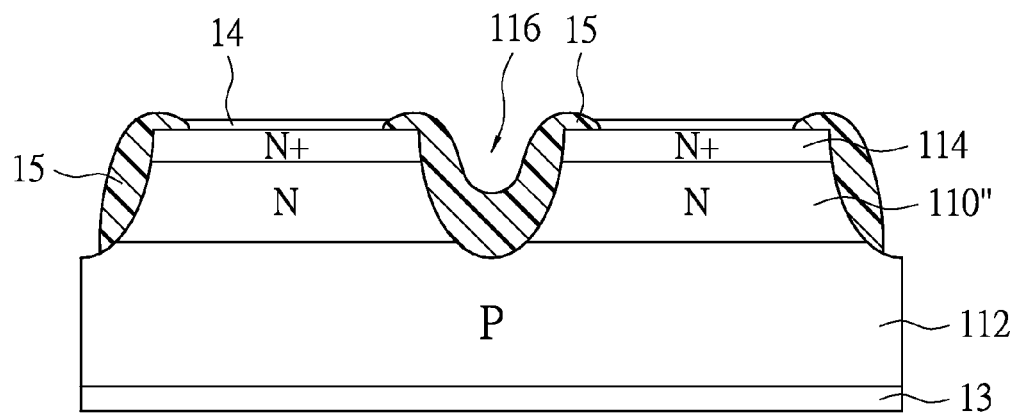
FIGS. 1A to 1E are the cross-section views of the manufacturing method to from the common P-type diode of the first embodiment in the present invention.
Figure 1B:
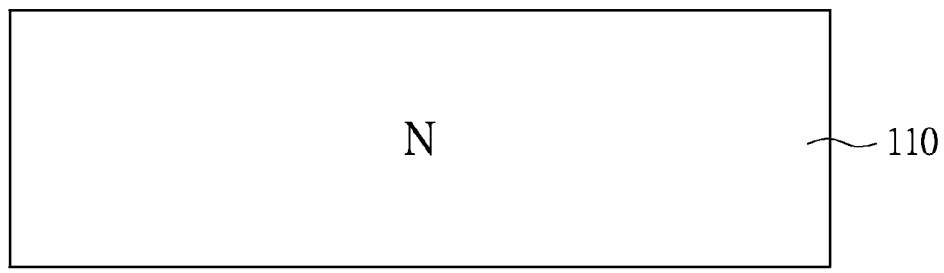
Figure 1C:
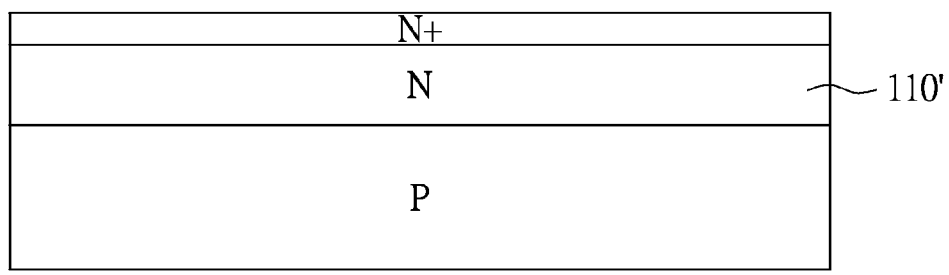

FIG. 1 is the perspective view of the bridge rectifier 1 of the first embodiment in the present invention. Referring to FIG. 1, the bridge rectifier 1 including a common P-type diode 11, a common N-type diode 12, two first metal layers 13, two pairs of the second metal layers 14, two pairs of insulating layers 15, two AC inputs 16a/16b and two DC outputs 17a/17b. FIG. 1A is the cross-section view of the common P-type diode 11 taken along a line A-A shown in FIG. 1. FIG. 1B is the cross-section view of the common N-type diode 12 taken along a line B-B shown in FIG. 1.

Figure 2A:
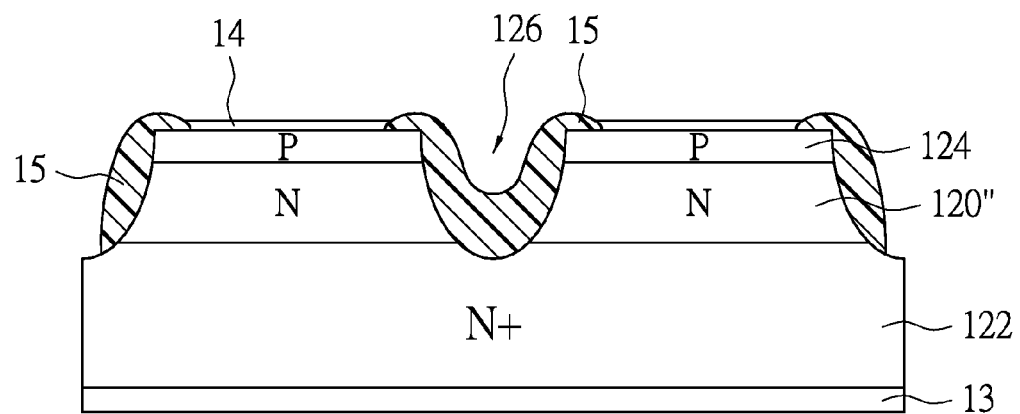
FIGS. 2A to 2E are the cross-section views of the manufacturing method to from the common N-type diode of the first embodiment in the present invention.

Referring to FIGS. 1A and 2A, specifically, the common P-type diode 11 includes a common P-type doping region 112, a pair of first N-type substrate regions 110", a pair of N-type doping regions 114 and a trench 116. The pair of first N-type substrate regions 110" is positioned on the common P-type doping region 112. The N-type doping regions 114 are positioned on the pair of first N-type substrate regions 110". In other words, the first N-type substrate regions 110" are positioned between the common P-type doping region 112 and the N-type doping regions 114. The doping concentration of N-type doping regions 114 is greater than the doping concentration of the common P-type doping region 112, and the doping concentration of the common P-type doping region 112 is greater than the doping concentration of the first N-type substrate regions 110". However, the present invention is not limited thereto.

In addition, the trench 116 exists between the first N-type substrate regions 110" and between the N-type doping regions 114. In other words, the trench 116 separates the first N-type substrate regions 110" and the N-type doping regions 114. The common P-type doping region 112 is not separated by the trench 116. Thus, one first N-type substrate regions 110", the N-type doping regions 114 atop the first N-type substrate region 110" and the common P-type doping region 112 below the first N-type substrate region 110" form a three layers N-N-P diode. The other first N-type substrate region 110" on the other side, the N-type doping regions 114 atop the first N-type substrate region 110", and the common P-type doping region 112 below the first N-type substrate region 110" form another three layers N-N-P diode. The above mentioned two diodes use the same common P-type doping region and are named as the common P-type diode. In fact, the common P-type diode 11 is a diode with the function of two diodes.

The common N-type diode 12 includes a common N-type doping region 122, a pair of second N-type substrate regions 120", a pair of P-type doping regions 124 and a trench 126. The pair of second N-type substrate regions 120" is positioned on the common N-type doping region 122. The pair of P-type doping regions 124 position on the pair of second N-type substrate regions 120" respectively. In other words, the second N-type substrate regions 120" position between the common N-type doping region 122 and the P-type doping regions 124. In addition, the doping concentration of the common N-type doping region 122 is greater than the doping concentration of the P-type doping regions 124. The doping concentration of P-type doping regions 124 is greater than the doping concentration of the second N-type substrate regions 120". Nevertheless, the present invention is not limited thereto.

The trench 126 exists between the second N-type substrate regions 120" and between the P-type doping regions 124. In other words, the trench 126 separates the second N-type substrate regions 120" and the P-type doping regions 124. The common N-type doping region 122 is not separated by the trench 126. Thus, one second N-type substrate region 120", the P-type doping regions 124 atop the second N-type substrate region 120" and the common N-type doping region 122 below the second N-type substrate region 120" form a three layers P-N-N diode. The other second N-type substrate region 120", the P-type doping regions 124 atop second N-type substrate region 120" and the common N-type doping region 122 below second N-type substrate region 120" form the other three layers P-N-N diode. The above mentioned two diodes use the same common N-type doping region 122 and are named as the common N-type diode. In fact, the common N-type diode 12 is a diode with the function of two diodes.

Referring to FIG. 1, FIG. 1A and FIG. 2A, the insulating layers 15 are positioned on the common P-type diode 11 and the common N-type diode 12 respectively and cover the side walls of the trench 116 and the trench 126. In addition, the insulating layers 15 expose the N-type doping regions 114 atop the common P-type diode 11 and the P-type doping regions 124 atop the common N-type diode 12. It's worth noting that, the insulating layers 15 is the protecting layer of the common P-type diode 11 and the common N-type diode 12. In addition, the material of the insulating layers 15 can be silicon oxide, semi-insulating polycrystalline silicon, passivation glass, silicon nitride or the combination of the above mentioned material. Nevertheless, the present invention is not limited thereto.

Moreover, two first metal layers 13 are positioned on the bottom of the common P-type diode 11 and the common N-type diode 12. Besides, the first metal layers 13 attach and connect to the common P-type doping region 112 and the common N-type doping region 122. Two pairs of the second metal layers 14 form on the top of the common P-type diode 11 and the common N-type diode 12. Specifically, one of the pairs of the second metal layers 14 attaches to the N-type doping regions 114 exposed by the insulating layer 15 in the common P-type diode 11. The other pair of the second metal layers 14 attaches to the P-type doping regions 124 exposed by the insulating layer 15 in the common N-type diode 12.

Referring to FIG. 1, the common P-type diode 11 is arranged beside the common N-type diode 12. Moreover, the bridge rectifier 1 includes two AC inputs 16a/16b and two DC outputs 17a/17b. As shown in FIG. 1, the AC inputs 16a/16b are positioned on the top of the common P-type diode 11 and the top of the common N-type diode 12. The AC input 16a connect to one of the second metal layers 14 on the common P-type diode 11 and one of the second metal layers 14 on the common N-type diode 12. The two second metal layers 14 are connect to each other by the AC input 16a. The other AC input 16b connect to the other second metal layer 14 of the common P-type diode 11 and the other second metal layer 14 of the common N-type diode 12. The two second metal layers 14 are connect to each other by the AC input 16b.

It's worth noting that, the AC inputs 16a/16b can electrical connect to the second metal layers of the common P-type diode 11 and the common N-type diode 12 by the frame or the bonding wire. The AC inputs 16a/16b further connect to the AC power supply to input the alternating current power.

The DC outputs 17a/17b are on the bottom of the common P-type diode 11 and the common N-type diode 12. The DC output 17a is on the bottom of the common P-type diode 11 and electrical connects to the first metal layer 13 of the common P-type diode 11. The DC output 17b is on the bottom of the common N-type diode 12 and electrical connects to the first metal layer 13 of the common N-type diode 12. In addition, the DC outputs 17a/17b further connect to the DC power supply to output the direct current power. Moreover, the bridge rectifier 1 further comprises a base (not show in the FIGs.). The common P-type diode 11, the common N-type diode 12, the AC inputs 16a/16b and the DC outputs 17a/17b can be positioned inside the base.

Figure 3:
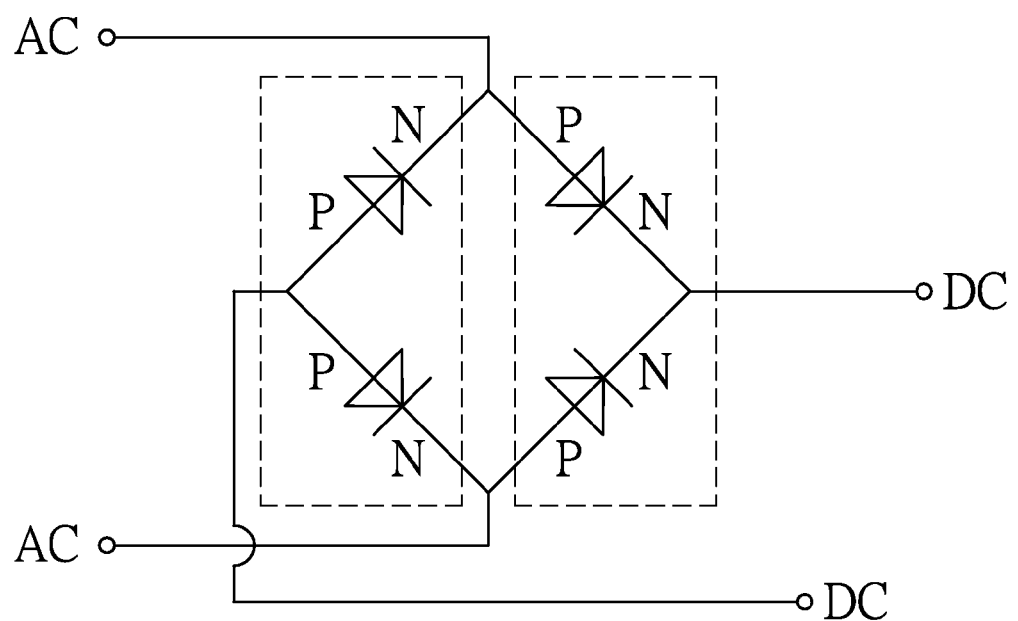
FIG. 3 is the circuit diagram of the bridge rectifier of the first embodiment in the present invention.

FIG. 3 is the circuit diagram of the bridge rectifier 1 of the first embodiment in the present invention. As shown in FIG. 3, the bridge rectifier 1 in the present invention has the rectifying function. The alternating current power inputs from the AC inputs 16a/16b to the common P-type diode 11 and the common N-type diode 12 is rectified to turn into the direct current power. The direct current power outputs from the DC outputs 17a/17b of the bridge rectifier 1.

The manufacturing method of the bridge rectifier 1 in the first embodiment is introduced in the following paragraph. FIGS. 1A to 1E are the cross-section views of the manufacturing method to from the common P-type diode 11 of the first embodiment in the present invention. FIGS. 2A to 2E are the cross-section views of the manufacturing method to from the common N-type diode 12 of the first embodiment in the present invention. Referring to FIGS. 1B and 2B, firstly, two N-type substrates 110, 120 are provided. The N-type substrate 110, 120 are the substrate with N-type doping. Next, referring to FIGS. 1C and 2C, two sides of each of the N-type substrates 110, 120 are preformed to doping to from the N-type substrates 110', 120'. One side of both N-type substrates 110', 120' is N-type heavy doping, and the other side of both N-type substrates 110', 120' is P-type doping.

In addition, the method of drive-in diffusion or ion implantation can be utilized to preform doping the N-type substrates 110, 120. The doping concentration of the N-type heavy doping is greater than the doping concentration of the P-type doping. The doping concentration of the P-type doping is greater than the original doping concentration of the N-type substrates 110, 120. Nevertheless, the present invention is not limited thereto.

Figure 1D:
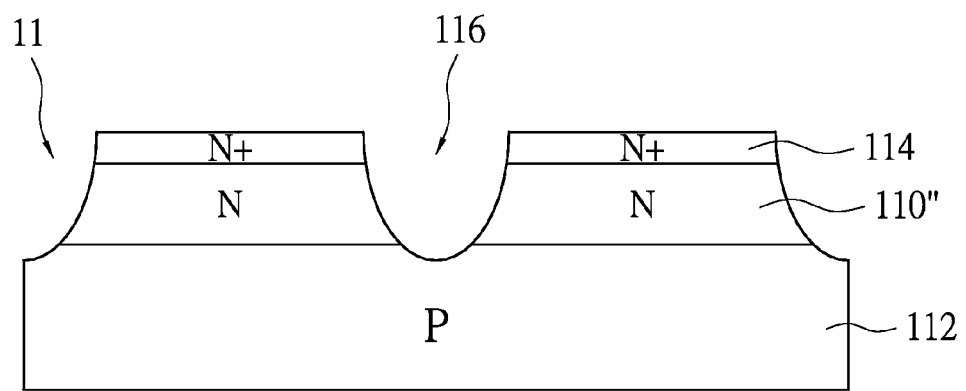
Figure 2B:
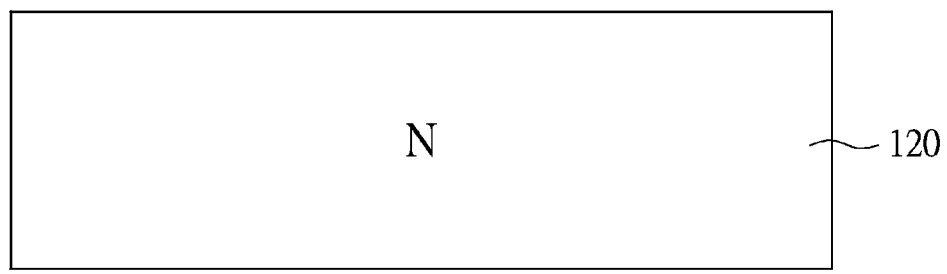
Figure 2C:
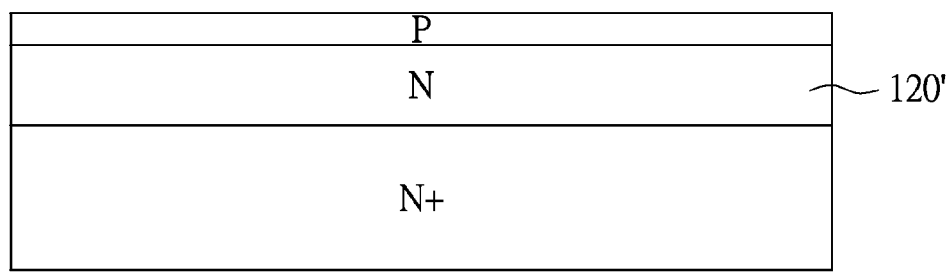
Figure 2D:
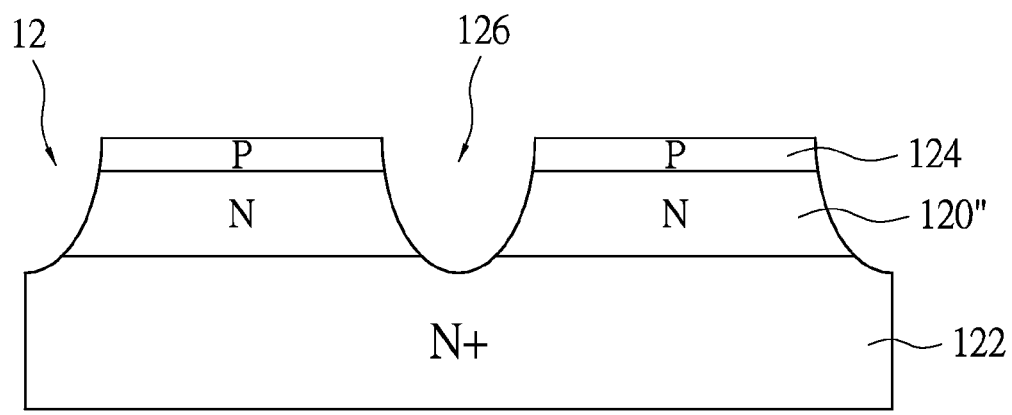

Next, referring to FIGS. 1D and 2D, a trench 116 is formed in the N-type substrate 110' to generate a common P-type diode 11. The trench 116 exists in the heavy doping region of the N-type substrate 110' and N-type doping regions 110' to from a pair N-type doping regions 114 and a pair of first N-type substrate regions 110". The trench 116 doesn't exist in the P-type doping region of the N-type substrate 110'. Thus a common P-type doping region 112 is formed. The first N-type substrate region 110" and the N-type doping regions 114 on one side of the trench 116 use the same common P-type doping region 112 with the first N-type substrate region 110" and the N-type doping regions 114 on the other side of the trench 116.

After that, the trench 126 is formed in the N-type substrate 120' to generate a common N-type diode 12. The trench 126 exists in the P-type doping region of the N-type substrate 120' and the N-type doping regions 120' to from a pair of the P-type doping regions 124 and a pair of the second N-type substrate regions 120". The trench 126 doesn't exist in the N-type doping region of the N-type substrate 120'. Thus, a common N-type doping region 122 is formed. The second N-type substrate region 120" and the P-type doping regions 124 on one side of the trench 126 use the same common N-type doping region 122 with the second N-type substrate region 120" and the P-type doping regions 124 on the other side of the trench 126. In addition, the method of wet-etching and dry-etching can be utilized to from the trench 126, 126.

It's worth noting that, the doping concentration of the N-type doping regions 114 is greater than the doping concentration of the common P-type doping region 112. The doping concentration of the common P-type doping region 112 is greater than the doping concentration of first N-type substrate regions 110". On the other hand, the doping concentration of the common N-type doping region 122 is greater than the doping concentration of P-type doping regions 124. The doping concentration of the common P-type doping regions 124 is greater than the doping concentration of second N-type substrate regions 120". Nevertheless, the present invention doesn't limited thereto. Moreover, the N-type substrates 110, 120 have more electron carriers. Compare to the P-type substrate with more electron hole carriers, the N-type substrates 110, 120 can provide lower resistance and higher transportation speed of the current.

Figure 1E:
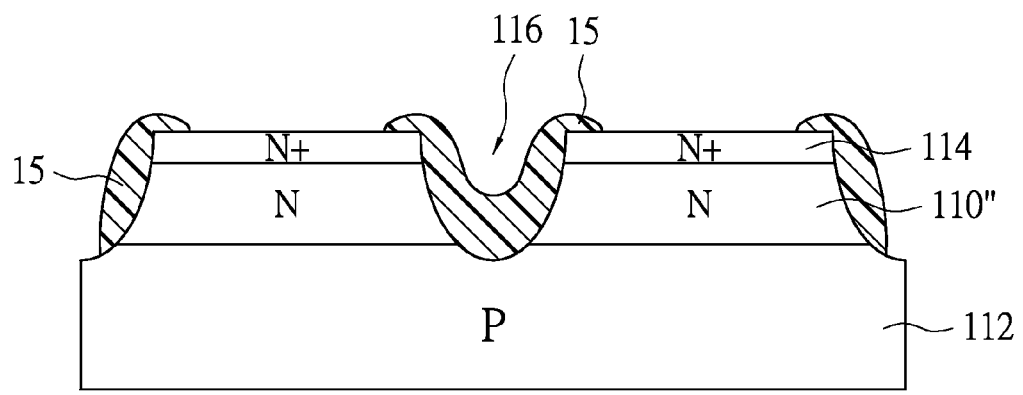
Figure 2E:
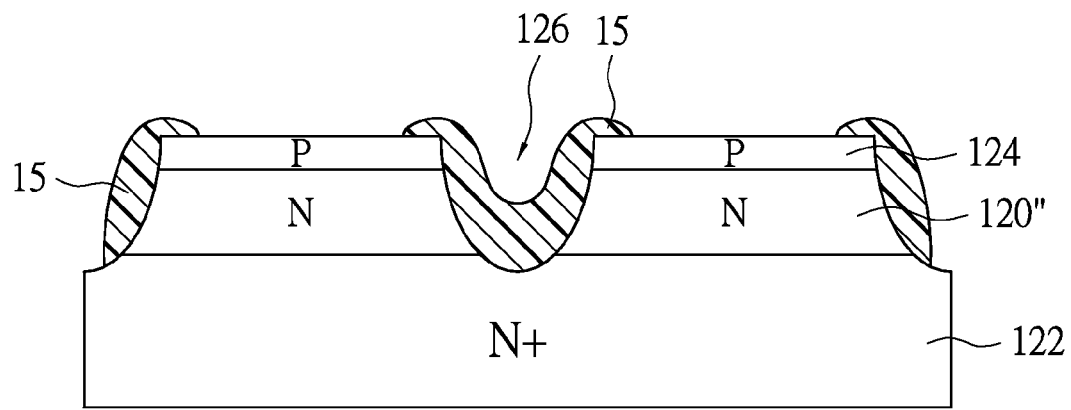

After that, referring to FIGS. 1E and 2E, the insulating layers 15 are formed on the common P-type diode 11 and the common N-type diode 12. One insulating layer 15 formed on the common P-type diode 11 covers the trench 116 and exposes the N-type doping regions 114 on the common P-type diode 11. The other insulating layer 15 formed on the common N-type diode 12 covers the trench 126 and exposes the P-type doping regions 124 on the common N-type diode 12. The material of the insulating layers 15 can be silicon oxide or silicon nitride. Nevertheless, the present invention is not limited thereto.

Referring to FIGS. 1A and 2A, next, one first metal layer 13 is formed on the common P-type doping region 112 of the common P-type diode 11 and attach to the common P-type doping region 112. The other first metal layer 13 is formed on the common N-type doping region 122 of the common N-type diode 12 and attach to the common N-type doping region 122. Then, one pair of the second metal layers 14 is formed on the N-type doping regions 114 exposed by the insulating layer 15 on the common P-type diode 11. The other pair of the second metal layers 14 is formed on the P-type doping region 124 exposed by the insulating layer 15 on the common N-type diode 12. In addition, it's worth noting that the method of sputtering, printing, spraying, electro plating, and electroless plating can be utilized to form the first metal layers 13 on the common P-type doping region 112 or on the common N-type doping region 122 and to form the second metal layers 14 on the N-type doping regions 114 or on the P-type doping regions 124.

Next, referring to FIG. 1, two AC inputs 16a/16b are formed and electrically connects to the second metal layers 14. Specifically, the AC input 16a electrically connect to one second metal layer 14 on the common P-type diode 11 and one second metal layer 14 on the common N-type diode 12. The two second metal layers 14 are electrically connect to each other. On the other hand, the AC input 16b electrically connect to the other second metal layer 14 on the common P-type diode 11 and the other second metal layer 14 on the common N-type diode 12. The two second metal layers 14 electrically connect to each other. The AC inputs 16a/16b each electrically connected with the second metal layers 14 on the common P-type diode 11 and the common N-type diode 12 by the frame or bonding wire. The AC inputs 16a/16b further connect to the alternating current power supply to input the alternating current.

After that, two DC outputs 17a/17b are formed to attach to the first metal layers 13 on the bottom of the common P-type diode 11 and common N-type diode 12. The DC output 17a is positioned on the bottom of the common P-type diode 11 and electrically connects to the first metal layer 13 of the common P-type diode 11. The DC output 17b is positioned on the bottom of the common N-type diode 12 and electrically connects to the first metal layer 13 of the common N-type diode 12. In addition, the DC outputs 17a/17b further each connect to the direct current supply to output the direct current.

Figure 4:
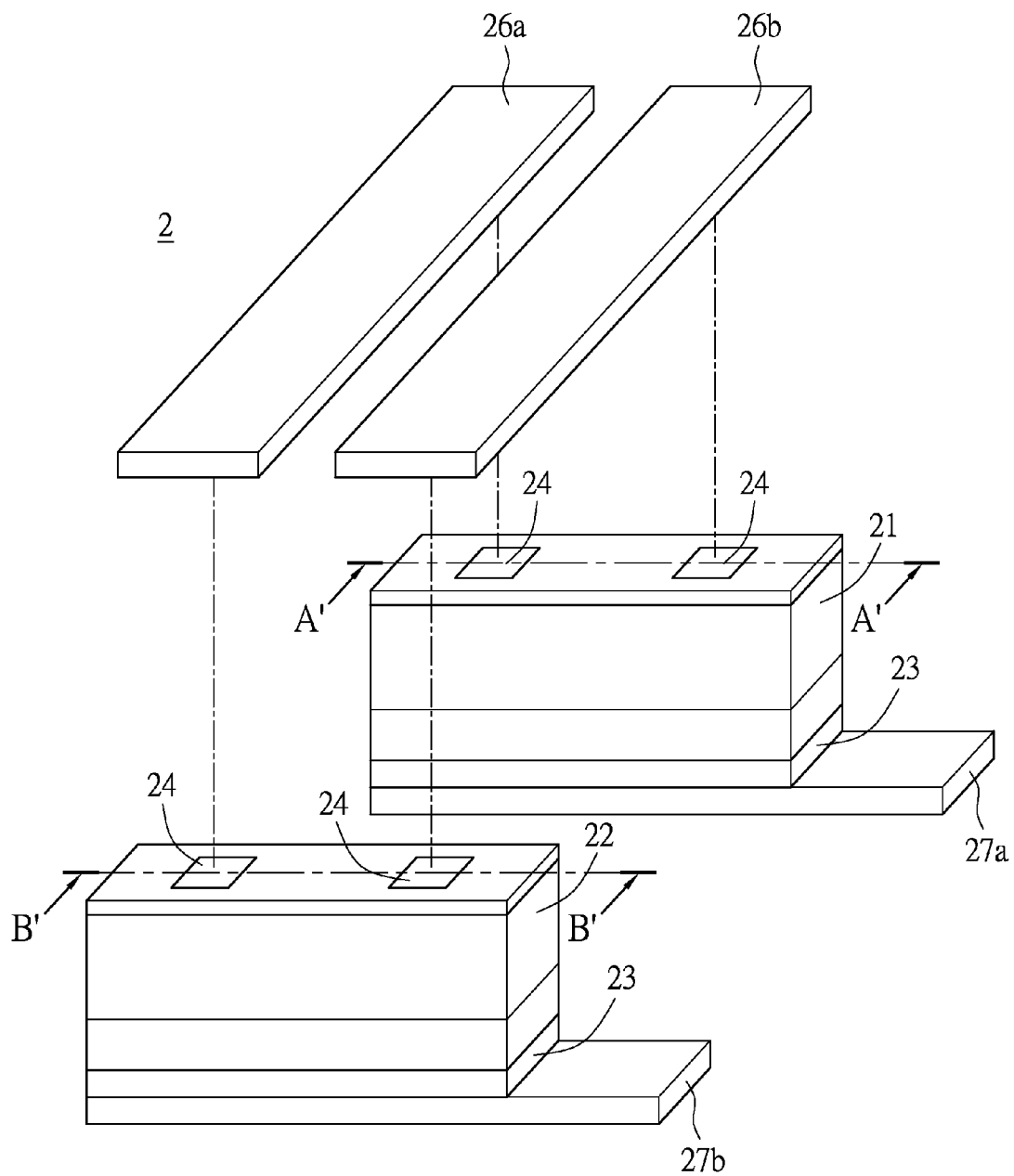
FIG. 4 is the perspective view of the bridge rectifier of the second embodiment in the present invention.
Figure 5A:
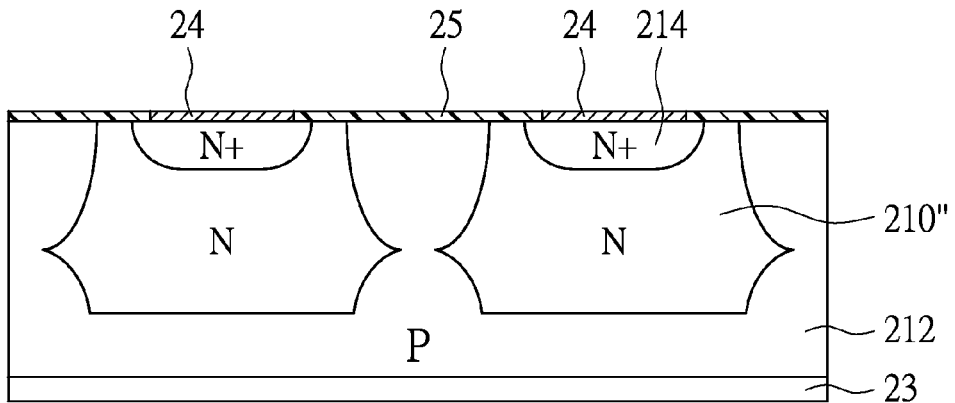
FIGS. 5A to 5E are the cross-section views of the manufacturing method to from the common P-type diode of the second embodiment in the present invention.
Figure 6A:
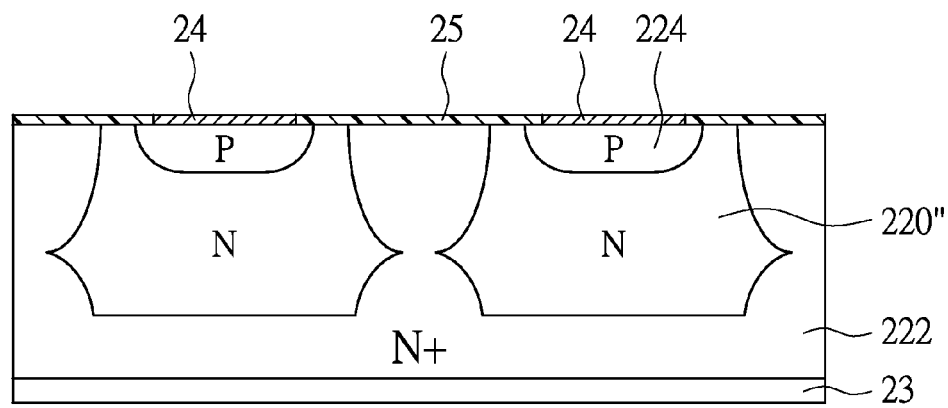
FIGS. 6A to 6E are the cross-section views of the manufacturing method to from the common N-type diode of the second embodiment in the present invention.

FIG. 4 is the perspective view of the bridge rectifier 2 of the second embodiment in the present invention. Referring to FIG. 4, the bridge rectifier 2 includes a common P-type diode 21, a common N-type diode 22, two first metal layers 23, two pairs of second metal layers 24, two insulating layers 25, two AC inputs 26a/26b and two DC outputs 27a/27b. FIG. 5A is the cross-section view of the common P-type diode 21 taken along a line A'-A' shown in FIG. 4. FIG. 6A is the cross-section view of the common N-type diode 22 taken along a line B'-B' shown in FIG. 4.

Referring to FIGS. 5A and 6A, specifically, in the present embodiment, the common P-type diode 21 includes a common P-type doping region 212, a pair of first N-type substrate regions 210", a pair of N-type doping regions 214. The different between first and second embodiment is that the common P-type diode 21 includes a P-type extending portion 216. The P-type extending portion 216 connects to the common P-type doping region 212 and is positioned between the pair of first N-type substrate regions 210" and between the pair of N-type doping regions 214. In other words, the P-type extending portion 216 replace the trench structure in the prior embodiment to separate the first N-type substrate regions 210" and the N-type doping regions 214. The common P-type doping region 212 is not separate by the P-type extending portion 216.

The first N-type substrate region 210" in both sides of the P-type extending portion 216 corresponding to the N-type doping regions 214 atop the first N-type substrate region 210" and the common P-type doping region 212 below the first N-type substrate region 210" form two three layers N-N-P diodes. The two diodes utilize the same common P-type doping region 212 and are named as the common P-type diode.

Moreover, the common N-type diode 22 includes a common N-type doping region 222, a pair of second N-type substrate regions 220", a pair of P-type doping regions 224. In addition, in the present, the common N-type diode 22 use a N-type extending portion 226 to replace the trench structure in the prior embodiment. The N-type extending portion 226 connect to the common N-type doping region 222 and separate the pair of second N-type substrate region 220" and a pair of P-type doping region 224, The second N-type substrate regions 220" in both side of the N-type extending portion 226 corresponding to the P-type doping regions 224 atop the second N-type substrate regions 220" and the common N-type doping region 222 below the second N-type substrate regions 220" form two three layers N-N-P diodes. The two diodes utilize the same common N-type and are named as the common N-type diode 22.

Referring to FIGS. 4, 5A and 6A, the insulating layers 25 are positioned on the common P-type diode 21 and on the common N-type diode 22 respectively. The insulating layer 25 on the common P-type diode 21 exposes the N-type doping regions 214 atop the common P-type diode 21. The insulating layer 25 on the common N-type diode 22 exposes the P-type doping regions 224 atop the common N-type diode 22. It's worth noting that, the insulating layers 25 is the protecting layer of the common P-type diode 21 and the common N-type diode 22. The material of the insulating layers 25 can be silicon oxide, semi-insulating polycrystalline silicon, passivation glass, silicon nitride, or the combination of the above mentioned material. Nevertheless, the present invention is not limited thereto.

The position of two first metal layers 23, two pairs of second metal layers 24, two AC inputs 26a/26b and two DC outputs 27a/27b on the common P-type diode 21 and the common N-type diode 22 are the same as the prior embodiment. In addition, the rectifying function is the same as the prior embodiment and is omitted thereto. The manufacturing method of the bridge rectifier 2 in the present invention is introduced in the following paragraph. FIGS. 5A to 5E are the cross-section views of the manufacturing method to from the common P-type diode 21 of the second embodiment in the present invention. FIGS. 6A to 6E are the cross-section views of the manufacturing method to from the common N-type diode 22 of the second embodiment in the present invention.

Figure 5B:
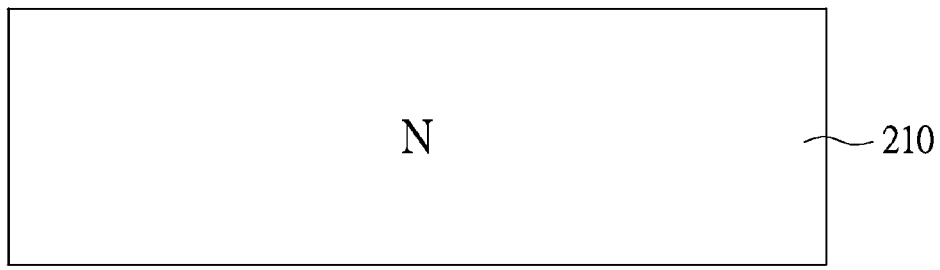
Figure 5C:
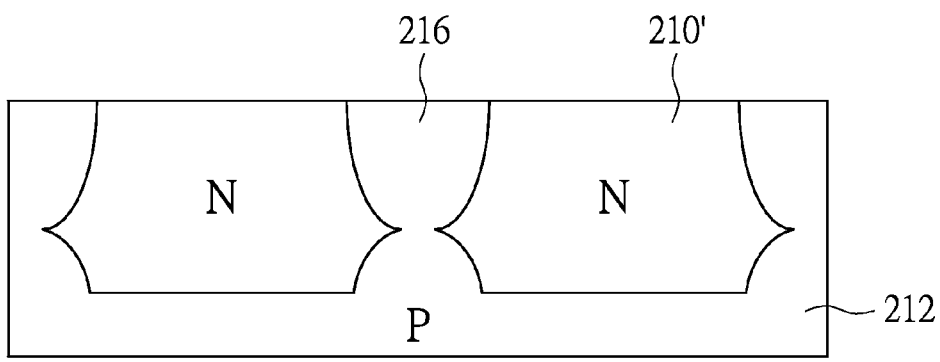
Figure 6B:
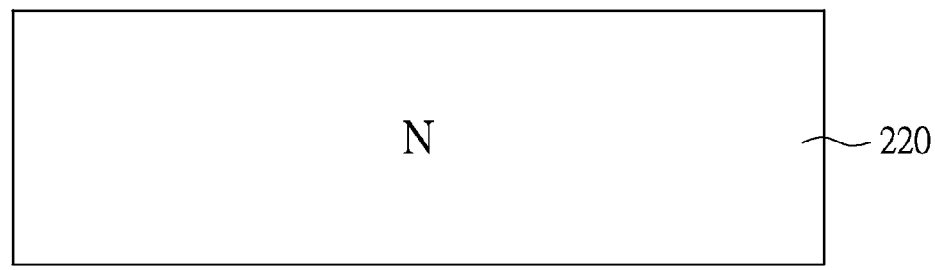
Figure 6C:
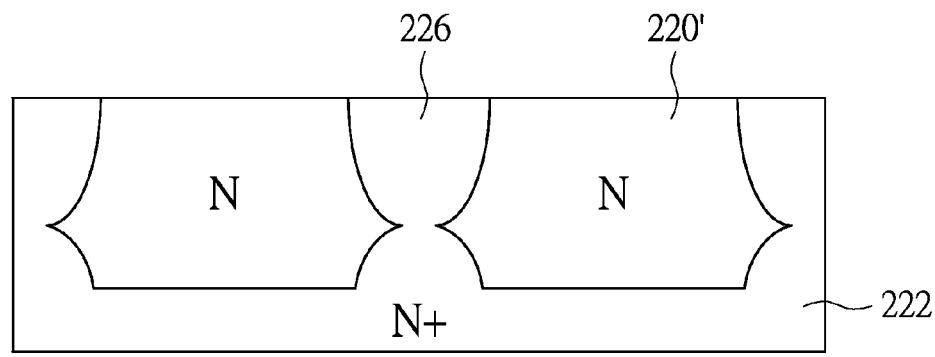

Referring to FIGS. 5B and 6B, two N-type substrates 210, 220 are provided. The N-type substrates 210, 220 are the substrate with N-type doping. Next, referring to FIGS. 5C and 6C, one side of the N-type substrate 210 is preformed P-type doping and the other side of the N-type substrate 210 is preformed partial P-type doping to from the common P-type doping region 212, a P-type extending portion 216 and a pair of first N-type substrate regions 210'. The P-type extending portion 216 connects to the common P-type doping region 212 and separates the first N-type substrate regions 210'. On the other hand, one side of the N-type substrate 220 is preformed N-type heavy doping, the other side of the N-type substrate 220 is preformed partial N-type heavy doping to form a common N-type doping region 222, a N-type extending portion 226 and a pair of second N-type substrate regions 220'. The N-type extending portion 226 connects to the common N-type doping region 222 and separates the second N-type substrate regions 220'. In the present invention, the P-type extending portion 216 and the N-type extending portion 226 can replace the trench 116, 126. The etching process can be omitted. Thus, the surfaces of the common P-type diode 21 and the common N-type diode 22 are flat.

Figure 5D:
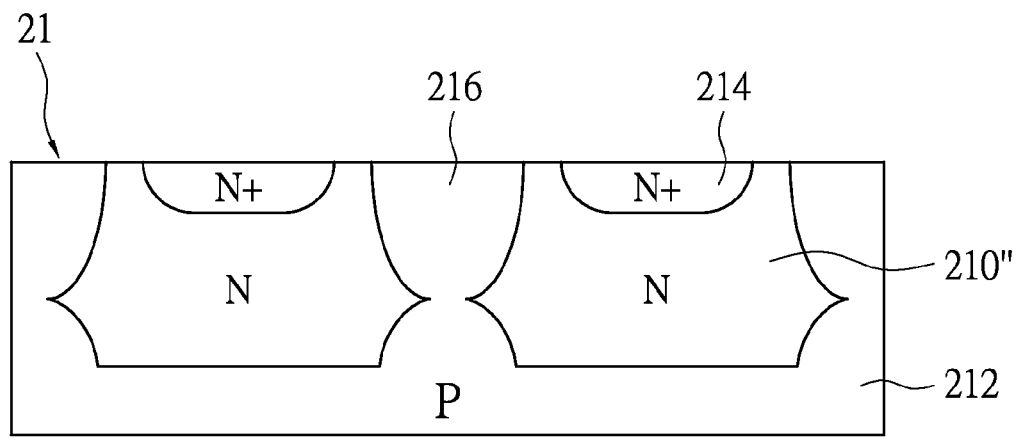
Figure 6D:
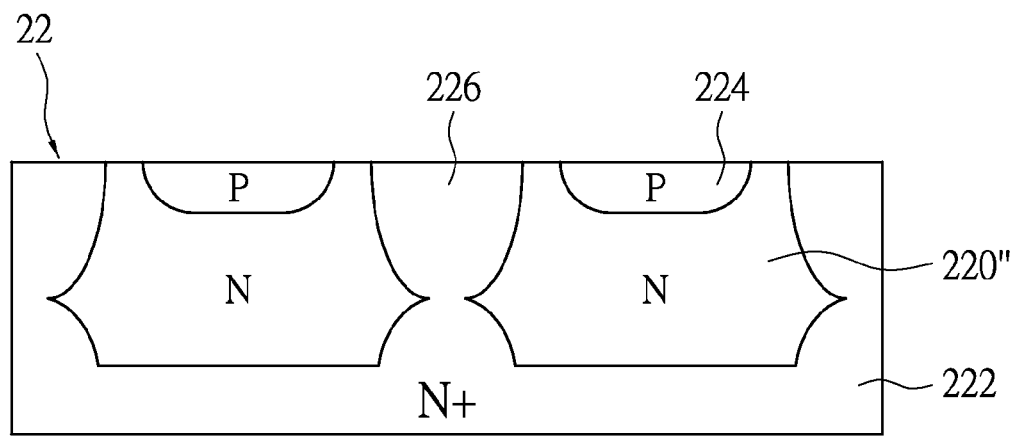

After that, referring to FIGS. 5D and 6D, the side of the N-type substrate 210' with partial P-type doping is preformed N-type heavy doping to form a pair of N-type doping regions 214 atop the first N-type substrate regions 210". The first N-type substrate regions 210" are positioned between the N-type doping regions 214 and the common P-type doping region 212. The first N-type substrate region 210" and the N-type doping regions 214 on one side of the P-type extending portion 216 use the same common P-type doping region 212 with the first N-type substrate region 210" and the N-type doping regions 214 on the other side of the P-type extending portion 216. In fact, the common P-type diode 21 is a diode with the function of two diodes.

In addition, the side of the N-type substrate 220' with partial N-type doping is preformed P-type doping to form a pair of P-type doping regions 224 atop the second N-type substrate regions 220". The second N-type substrate regions 220" are positioned between the P-type doping regions 224 and the common N-type doping region 222. The second N-type substrate regions 220" and the P-type doping regions 224 on one side of the N-type extending portion 226 use the same common N-type doping region 222 with the second N-type substrate regions 220" and P-type doping regions 224 on the other side of the N-type extending portion 226. In fact, the common N-type diode 22 is a diode with the function of two diodes.

It's worth noting that the common P-type doping region 212, the doping concentration of the N-type doping regions 214 is greater than the doping concentration of the common P-type doping region 212. The doping concentration of the common P-type doping region 212 is greater than the doping concentration of the first N-type substrate regions 210". On the other hand, the doping concentration of the common N-type doping region 222 is greater than the doping concentration of the P-type doping regions 224. The doping concentration of the P-type doping regions 224 is greater than the doping concentration of the second N-type substrate regions 220". Nevertheless, the present invention is not limited thereto. In addition, the N-type substrates 210, 220 are with more electron carriers. Compare to the P-type substrate with more electron hole carriers, the N-type substrates 210, 220 can provide lower resistance and higher transportation speed of the current.

Figure 5E:
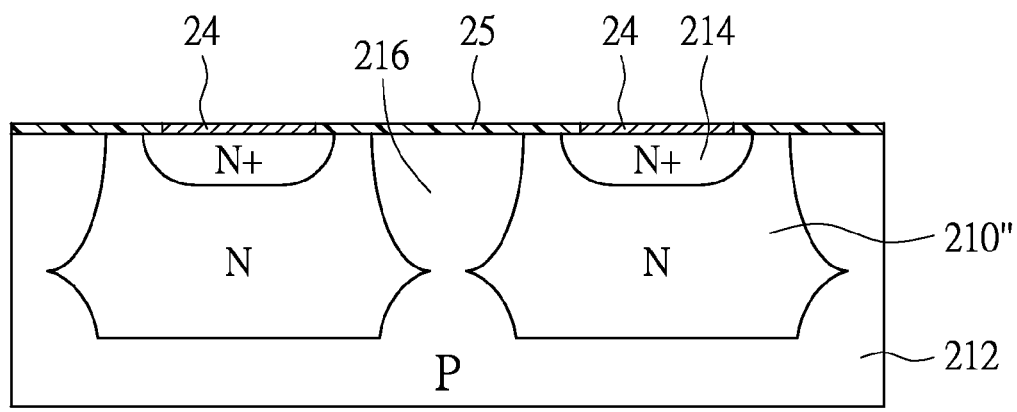
Figure 6E:
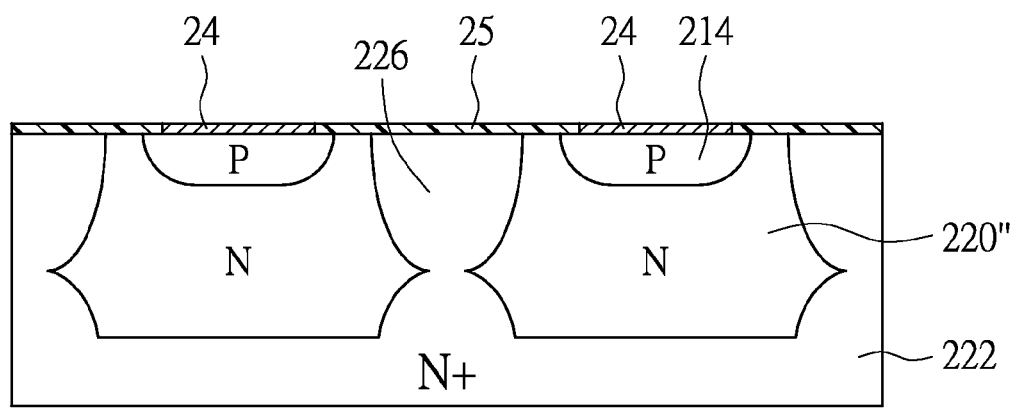

Next, referring to FIGS. 5E and 6E, the insulating layers 25 are formed on the common P-type diode 21 and the common N-type diode 22 respectively. The insulating layer 25 on the common P-type diode 21 exposes the N-type doping regions 214 on the common P-type diode 21. The insulating layer 25 on the common N-type diode 22 exposes the P-type doping regions 224 on the insulating layer 25. The material of the insulating layers 25 can be silicon oxide, semi-insulating polycrystalline silicon, passivation glass, silicon nitride, or the combination of the above mentioned material. Nevertheless, the present invention is not limited thereto.

After that, as shown in FIGS. 5A, 4, and 6A, two first metal layers 23, two pairs of second metal layers 24, two pairs of AC inputs 26a/26b, and two pairs of DC outputs 27a/27b are formed. The manufacturing method or the position are similar as the first embodiment and are omitted thereof.

To sum up, the present invention provides a bridge rectifier and the manufacturing method for the same. The bridge rectifier includes a common P-type diode and a common N-type diode. The common P-type diode includes two separated N-type electrodes. The two separated N-type electrodes use the same common P-type doping region. The common N-type diode includes two separated P-type electrodes. The two separated P-type electrodes use the same common N-type doping region. The number of the common P/N type diodes in the present invention can be decreased. Thus, the manufacturing method of the bridge rectifier can be simplified. Moreover, the N-type substrate with electron carrier is utilized in the common P/N type diode. Thus, the bridge rectifier in present invention can provide lower resistance and higher transportation speed of the current.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A bridge rectifier comprising:
   a common P-type diode comprising a common P-type doping region, a pair of first N-type substrate regions and a pair of N-type doping regions, the first N-type substrate regions positioned between the common P-type doping region and the N-type doping regions;
   a common N-type diode comprising a common N-type doping region, a pair of second N-type substrate regions and a pair of P-type doping regions, the second N-type substrate regions positioned between the common N-type doping region and the P-type doping regions;
   two first metal layers connected to the common N-type doping region and the common P-type doping region respectively;
   two pairs of second metal layers connected to the pair of N-type doping regions and the pair of P-type doping regions respectively;
   two AC inputs connecting to one of the second metal layers of the common N-type diode and one of the second metal layers of the common P-type diode; and
   two DC outputs connecting to two first metal layers respectively.

2. The bridge rectifier of claim 1, wherein the common P-type diode and the common N-type diode each has a trench, wherein the trench of the common P-type diode exists between two of the N-type doping regions and between two of the first N-type substrate regions, and the trench of the common N-type diode exists between two of the P-type doping regions and two of the second N-type substrate regions.

3. The bridge rectifier of claim 2, wherein the bridge rectifier further comprises two insulating layers; the insulating layers covering the common P-type diode and the common N-type diode; wherein the insulating layer covering the common P-type diode covers the trench of the common P-type diode and exposes the N-type doping regions, and the insulating layer covering the common N-type diode covers the trench of the common N-type diode and exposes the P-type doping regions.

4. The bridge rectifier of claim 1, wherein the common P-type diode further comprises a P-type extending portion, and the common N-type diode further comprises a N-type extending portion;
   wherein the P-type extending portion is positioned between two of the N-type doping regions and two of the first N-type substrate regions of the common P-type diode;
   wherein the N-type extending portion is positioned between two of the P-type doping regions and two of the second N-type substrate regions.

5. The bridge rectifier of claim 4, wherein the bridge rectifier further comprises two insulating layers, the insulating layers covering the common P-type diode and the common N-type diode respectively,
   wherein the insulating layer covers the common P-type diode exposes the N-type doping regions;
   wherein the insulating layer covers the common N-type diode exposes the P-type doping regions.

* * * * *